(12) United States Patent
Isoda et al.

(10) Patent No.: US 10,154,602 B2
(45) Date of Patent: Dec. 11, 2018

(54) METHOD OF MANUFACTURING A DEVICE MODULE

(71) Applicant: HOSIDEN CORPORATION, Yao-shi (JP)

(72) Inventors: Takeshi Isoda, Yao (JP); Koji Shinoda, Yao (JP)

(73) Assignee: HOSIDEN CORPORATION, Yao-shi (JP)

( * ) Notice: Subject to any disclaimer, the term of this patent is extended or adjusted under 35 U.S.C. 154(b) by 12 days.

(21) Appl. No.: 15/248,154

(22) Filed: Aug. 26, 2016

(65) Prior Publication Data

US 2016/0366779 A1     Dec. 15, 2016

Related U.S. Application Data

(62) Division of application No. 13/958,912, filed on Aug. 5, 2013, now abandoned.

(30) Foreign Application Priority Data

Aug. 7, 2012   (JP) ................. 2012-174790

(51) Int. Cl.
    *B29C 45/14*    (2006.01)
    *H05K 7/02*     (2006.01)
    (Continued)

(52) U.S. Cl.
    CPC ............. *H05K 7/02* (2013.01); *B29C 33/126* (2013.01); *B29C 45/14065* (2013.01);
    (Continued)

(58) Field of Classification Search
    None
    See application file for complete search history.

(56) References Cited

U.S. PATENT DOCUMENTS

| | | |
|---|---|---|
| 4,218,724 A | 8/1980 | Kaufman |
| 4,338,621 A | 7/1982 | Braun |
| (Continued) | | |

FOREIGN PATENT DOCUMENTS

| | | |
|---|---|---|
| DE | 1971436 | 11/1998 |
| DE | 102011117985 | 5/2013 |
| (Continued) | | |

OTHER PUBLICATIONS

JP 2012-174790: Notification of Reasons for Refusal dated Sep. 17, 2013.

(Continued)

*Primary Examiner* — Edmund H Lee
(74) *Attorney, Agent, or Firm* — Kratz, Quintos & Hanson, LLP

(57) ABSTRACT

The invention provides a device module that can be manufactured with a die. The device module includes a plastic part, a device, a holder, and an external connection. The device is embedded in the plastic part. The holder is embedded in the plastic part and includes an exposed portion exposed from the plastic part in a thickness direction of the plastic part in such a manner as to close a housing recess of the die. The external connection is connected to the device and partially fixed to the holder. The external connection includes a lead-out portion insertable in the housing recess of the die. The lead-out portion is embedded in the plastic part and being led out of the plastic part in the thickness direction. Alternatively, the lead-out portion is led through and out of the holder in the thickness direction.

20 Claims, 7 Drawing Sheets

(51) Int. Cl.
*H05K 13/04* (2006.01)
*G06F 3/038* (2013.01)
*G06F 1/16* (2006.01)
*G06F 3/041* (2006.01)
*B29C 33/12* (2006.01)
*H05K 5/02* (2006.01)
*B29K 667/00* (2006.01)
*B29L 31/34* (2006.01)

(52) U.S. Cl.
CPC ............ *G06F 1/169* (2013.01); *G06F 1/1656* (2013.01); *G06F 3/038* (2013.01); *G06F 3/041* (2013.01); *H05K 5/0247* (2013.01); *H05K 13/04* (2013.01); *B29C 2045/14131* (2013.01); *B29K 2667/003* (2013.01); *B29L 2031/3481* (2013.01); *Y10T 29/49117* (2015.01)

(56) References Cited

U.S. PATENT DOCUMENTS

| | | | |
|---|---|---|---|
| 4,395,375 A * | 7/1983 | Ferris | B29C 45/14639 264/261 |
| 4,480,262 A | 10/1984 | Butt | |
| 4,561,006 A | 12/1985 | Currie | |
| 4,574,474 A * | 3/1986 | Langham | B29C 45/14639 264/272.15 |
| 4,582,388 A * | 4/1986 | Swaffield | H01J 29/925 264/272.11 |
| 4,607,276 A | 8/1986 | Butt | |
| 4,816,426 A | 3/1989 | Bridges et al. | |
| 4,823,234 A | 4/1989 | Konishi et al. | |
| 4,827,376 A | 5/1989 | Voss | |
| 4,894,023 A | 1/1990 | Hall | |
| 4,935,174 A | 6/1990 | Suzuki | |
| 5,103,292 A | 4/1992 | Mahulikar | |
| 5,319,522 A | 6/1994 | Mehta | |
| 5,610,799 A | 3/1997 | Kato | |
| 5,710,695 A | 1/1998 | Manteghi | |
| 5,739,463 A | 4/1998 | Diaz et al. | |
| 5,793,613 A | 8/1998 | Poinelli et al. | |
| 5,828,126 A | 10/1998 | Thomas | |
| 5,841,187 A | 11/1998 | Sugimoto et al. | |
| 5,926,952 A * | 7/1999 | Ito | B29C 45/14065 264/264 |
| 6,153,140 A * | 11/2000 | Hirai | B29C 33/14 264/272.15 |
| 6,433,728 B1 | 8/2002 | Krupp et al. | |
| 6,653,724 B1 | 11/2003 | Kim et al. | |
| 6,837,746 B2 * | 1/2005 | Okamoto | H01R 43/24 264/263 |
| 6,950,068 B2 | 9/2005 | Bordi et al. | |
| 7,146,721 B2 | 12/2006 | Hunkeler et al. | |
| 7,166,812 B2 | 1/2007 | White et al. | |
| 7,194,910 B2 | 3/2007 | Gatesman | |
| 7,217,153 B2 | 5/2007 | Sugimoto et al. | |
| 7,278,862 B2 * | 10/2007 | Nagashima | H01R 13/504 439/79 |
| 7,679,923 B2 | 3/2010 | Inagaki et al. | |
| 7,724,204 B2 | 5/2010 | Annamaa et al. | |
| 7,804,450 B2 | 9/2010 | Sullivan et al. | |
| 8,118,583 B2 * | 2/2012 | Nagashima | B29C 45/0046 264/259 |
| 8,178,961 B2 | 5/2012 | Han et al. | |
| 8,441,117 B2 | 5/2013 | Soyano | |
| 9,029,999 B2 | 5/2015 | Lo | |
| 2002/0180424 A1 | 12/2002 | Aoki et al. | |
| 2004/0147297 A1 | 7/2004 | Mikkola et al. | |
| 2004/0248439 A1 | 12/2004 | Gernhardt et al. | |
| 2005/0057902 A1 * | 3/2005 | Sasaki | B60R 16/0239 361/717 |
| 2005/0136852 A1 | 6/2005 | Nakagawa et al. | |
| 2008/0012173 A1 * | 1/2008 | Asao | B29C 45/14639 264/255 |
| 2009/0261962 A1 | 10/2009 | Buck et al. | |

FOREIGN PATENT DOCUMENTS

| | | |
|---|---|---|
| EP | 1672972 | 6/2006 |
| EP | 1677583 | 7/2006 |
| EP | 2366526 | 9/2011 |
| JP | 2003-086293 | 3/2003 |
| JP | 2003-229205 | 8/2003 |
| JP | 2008-018633 | 1/2008 |
| JP | 2011-126236 | 6/2011 |
| JP | 2012-011691 | 1/2012 |

OTHER PUBLICATIONS

EP 13250086.9: Extended European Search Report dated Dec. 2, 2013.

* cited by examiner

METHOD OF MANUFACTURING A DEVICE MODULE

CROSS-REFERENCE TO RELATED APPLICATIONS

The present application is a divisional of U.S. patent application Ser. No. 13/958,912, filed Aug. 5, 2016, now Abandoned, which claims priority under 35 U.S.C. § 119 of Japanese Patent Application No. 2012-174790 filed on Aug. 7, 2012, the disclosures of which are expressly incorporated by reference herein in their entity.

BACKGROUND OF THE INVENTION

Technical Field

The invention relates to device modules and methods of manufacturing the device modules.

Background Art

A conventional device module includes a film, a plastic part provided on the film, a functional device embedded in the plastic part, and a transmission cable. The transmission cable has a first end portion connected to the functional device and embedded in the plastic part together with the functional device, and a remaining portion protruding from the plastic part in the thickness direction of the plastic part (see FIG. 3 of Japanese Unexamined Patent Publication No. 2011-126236).

SUMMARY OF INVENTION

When the plastic part is molded on the film using a die, the above remaining portion of the transmission cable is housed in a housing recess of the die. The housing recess communicates with a cavity in the die. To prevent the ingress of plastic material into the housing recess, it is required that the shape of the housing recess should conform to the outer shape of the remaining portion of the transmission cable. However, meeting this requirement would make it very difficult to insert the remaining portion of the transmission cable into the housing recess of the die.

The invention is made in view of the above circumstances. The invention provides a device module capable of preventing plastic material from flowing into the housing recess of the die that houses a part of the external connection and capable of inserting the part of the external connection easily into the housing recess of the die. The invention also provides a method of manufacturing the device module.

The device module according to an aspect of the invention can be manufactured with a die. The device module includes a plastic part, a device, a holder, and an external connection. The device is a sensor, an electronic component, or a circuit board, the device being embedded in the plastic part. The holder is embedded in the plastic part and includes an exposed portion exposed from the plastic part in a thickness direction of the plastic part in such a manner as to close a housing recess of the die. The external connection is connected to the device and partially fixed to the holder. The external connection includes a lead-out portion insertable in the housing recess of the die. The lead-out portion is embedded in the plastic part and being led out of the plastic part in the thickness direction. Alternatively, the lead-out portion is led through and out of the holder in the thickness direction.

In the device module in accordance with this aspect, the holder is embedded in the plastic part, and the exposed portion of the holder is exposed from the plastic part in the thickness direction in such a manner as to close a housing recess of the die. The external connection is partially fixed to the holder, and the lead-out portion of the external connection is led out of the plastic part or the holder in the thickness direction. This arrangement makes it possible to insert the lead-out portion of the external connection into the housing recess of the die and close the housing recess of the die with the exposed portion of the holder when embedding the device and the holder in the plastic part with the die (when molding plastic material). Therefore, it is possible to prevent the ingress of the plastic material of the plastic part into the housing recess of the die. Further, the housing recess of the die can be sized such as to receive the lead-out portion of the external connection with ease because the housing recess will be closed with the exposed portion of the holder.

The holder may include a base embedded in the plastic part and the exposed portion protruding from the plastic part in the thickness direction in such a manner as to fit in the housing recess of the die. In the device module in accordance with this aspect, the holder can easily close the housing recess of the die because the exposed portion of the holder, which protrudes from the plastic part, fits in the housing recess of the die when molding the plastic material.

The exposed portion of the holder may be tapered. The device module in accordance with this aspect is adapted for easy fitting of the exposed portion of the holder into the housing recess of the die when molding the plastic material.

If the die includes a fitting projection provided on an edge of the housing recess, the exposed portion may include a fitting recess to fit over the fitting projection. In the device module in accordance with this aspect, the holder can easily close the housing recess of the die because the fitting projection of the die fits in the fitting recess of the exposed portion when molding the plastic material.

The device module may further include a sheet having a first face provided with the plastic part. The external connection may include an embedded portion embedded in the plastic part. At least a part of the embedded portion may be disposed on the first face of the sheet, and the holder is disposed on the at least the part of the embedded portion. In the device module in accordance with this aspect, the sheet, at least a part of the embedded portion, and the holder are stacked in this order. For this reason, when molding the plastic material, the holder is disposed on the part of the embedded portion on the first face of the sheet, closes the housing recess of the die, and is in contact with the die. In other words, the holder is securely held between the part of the embedded portion on the first face of the sheet and the die, reducing the possibility of movement of the holder and the external connection due to pressure on the holder by the plastic material injected into the die.

A gap may be left between the holder and the sheet. The gap may be filled with plastic material of the plastic part. In the device module in accordance with this aspect, the gap between the holder and the sheet is filled with plastic material of the plastic part, so that the outer shape of the holder is unlikely to appear on the sheet. This improves the surface accuracy of the portion of the sheet opposed to the holder.

The holder may have a through hole passing through the holder in the thickness direction to receive therethrough the lead-out portion of the external connection. The device module in accordance with this aspect is so configured as to fix the lead-out portion to the holder with ease, merely by inserting the lead-out portion of the external connection into the through hole of the holder.

The external connection may be partially fixed to an outer face of the holder. The external connection and the holder in combination may close the housing recess of the die. The device module in accordance with this aspect is so configured as to fix the lead-out portion to the holder with ease, merely by fixing the lead-out portion of the external connection to the outer face of the holder.

The lead-out portion of the external connection may be partially embedded in the holder. In the device module in accordance with this aspect, the lead-out portion of the external connection can be partially embedded in the holder by insert-molding or other means. Therefore, it is easy to fix the lead-out portion to the holder.

The holder may include a plurality of pieces surrounding a part of the lead-out portion of the external connection. The device module in accordance with this aspect is so configured as to fix the lead-out portion to the holder with ease, merely by combining the pieces of the holder so as to surround the lead-out portion of the external connection.

The holder may be made of plastic material that is the same as or in a same group as that of the plastic part. In the device module in accordance with this aspect, the holder is visually unobtrusive when seen through the plastic part, thereby enhancing the aesthetic appearance of the device module.

A method of manufacturing method a device module according to the invention includes partially fixing an external connection to a holder, a first end of the external connection being connected to a device, the device being a sensor, an electronic component, or a circuit board; placing the device, a first end portion of the external connection, and the holder into a cavity of first and second dies, inserting a second end portion of the external connection into a housing recess of the first die, and closing the housing recess of the first die with the holder; and in this state, injecting plastic material into the cavity to insert-mold the device, the first end portion of the external connection, and the holder in the plastic material.

In the manufacturing method in accordance with this aspect, when the device and the holder are insert-molded in the plastic material using the first and second dies, it is possible to close the housing recess of the first die, by inserting the second end portion of the external connection into the housing recess of the first die. It is therefore possible to prevent the ingress of the plastic material into the housing recess of the first die. Further, the housing recess of the die can be sized such as to receive the lead-out portion of the external connection with ease because the housing recess will be closed with the holder.

The closing of the housing recess may include fitting a distal portion of the holder in the housing recess of the first die. The manufacturing method in accordance with this aspect makes it easy to close the housing recess of the die with the holder, by fitting the distal portion of the holder in the housing recess.

The distal portion of the holder may be tapered. The manufacturing method in accordance with this aspect makes it easy to fit the distal portion of the holder in the housing recess of the die when molding the plastic material.

At least a part of an edge of the housing recess of the first die may form a tapered portion. The manufacturing method in accordance with this aspect makes it possible to easily fit the distal portion of the holder into the housing recess because the tapered portion guides the distal portion of the holder into the housing recess of the first die.

The closing of the housing recess may include fitting a fitting projection into a fitting recess of the holder. The fitting projection may be provided on an edge of the housing recess of the first die. The manufacturing method in accordance with this aspect makes it easy to close the housing recess of the die with the holder, by fitting the fitting projection of the first die in the fitting recess of the holder.

The placing of the device, the first end portion of the external connection, and the holder into the cavity may include placing a sheet in the cavity, disposing at least a part of the external connection on the sheet, disposing the holder on the at least the part of the external connection, and bringing the holder into contact with the first die to close the housing recess of the first die. The injecting of the plastic material may include injecting the plastic material on the sheet to insert-mold the device, the first end portion of the external connection, and the holder on the sheet with the plastic material.

In the manufacturing method in accordance with this aspect, when molding the plastic material, the holder is disposed on a part of the external connection on the first face of the sheet, closes the housing recess of the die, and is in contact with the die. In other words, the holder is securely held between the first and second dies via the sheet and the part of the external connection, reducing the possibility of movement of the holder and the external connection due to pressure on the holder by the plastic material injected into the cavity.

The placing of the device, the first end portion of the external connection, and the holder may include bringing the holder into contact with the first die and the second die to close the housing recess of the first die. In the manufacturing method in accordance with this aspect, the holder is securely held between the first and second dies when molding the plastic material, reducing the possibility of movement of the holder and the external connection due to pressure on the holder by the plastic material injected into the cavity.

The closing of the housing recess of the first die may include fixing the holder to the first die. In the manufacturing method in accordance with this aspect, the holder is fixed to the first die when molding the plastic material, reducing the possibility of movement of the holder and the external connection due to pressure on the holder by the plastic material injected into the cavity.

A gap may be left between the holder and the sheet in the cavity. The injecting of the plastic material into the cavity may include flowing the plastic material into the gap. In the manufacturing method in accordance with this aspect, the gap between the holder and the sheet is filled with the plastic material of the plastic part, so that the outer shape of the holder is unlikely to appear on the sheet. This improves the surface accuracy of the portion of the sheet opposed to the holder.

The holder may have a through hole passing through the holder in the thickness direction. The fixing of the external connection to the holder may include inserting the external connection into the through hole of the holder. Alternatively, the fixing of the external connection to the holder may include fixing a part of the external connection to an outer face of the holder. In this case, the housing recess may be closed with the part of the external connection and the holder. Further alternatively, the fixing of the external connection to the holder may include insert-molding a part of the external connection in the holder.

The holder may include a plurality of pieces configured to surround a part of the external connection. The fixing of the external connection to the holder may include combining the parts to surround the plurality of pieces of the external connection.

The holder may be made of plastic material that is the same as or in a same group as that of the plastic part. In the device module in accordance with this aspect, the holder is visually unobtrusive when seen through the plastic part, thereby enhancing the aesthetic appearance of the device module.

DESCRIPTION OF EMBODIMENTS

First to Fifth Embodiments of the invention will be described below.

First Embodiment

Figure 1:
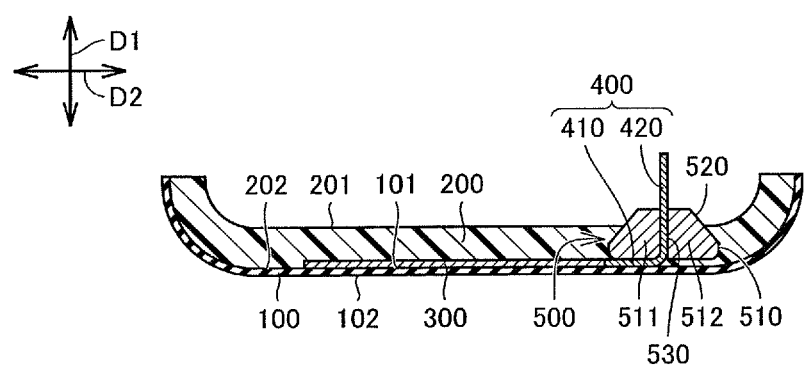
FIG. 1 is a schematic sectional view showing a device module in accordance with the First Embodiment of the invention.

First, a device module in accordance with the First Embodiment of the invention will be described with reference to FIG. 1. The device module shown in FIG. 1 is a touch sensing device. The device module includes a sheet 100, a plastic part 200, a touch sensor 300 (device), an external connection 400, and a holder 500. These constituents of the device module will be described below in detail. In FIG. 1, D1 refers to the thickness direction of the device module and the plastic part 200, and D2 refers to the lengthwise direction of the device module. D1 is orthogonal to D2. The short direction (not shown) of the device module is orthogonal to D1 and D2.

The sheet 100 is a substantially rectangular flexible film of optically transparent plastic material such as a PET (polyethylene terephthalate) film or an acrylic film. The sheet 100 has a first face 101 (an inner face) and a second face 102 (an outer face). Ornamental printing is provided on the entire region or a partial region (e.g., a circumferential region, or one end in the lengthwise direction D2 or in the short direction) of the first face 101 of the sheet 100.

The plastic part 200 is an insulating member of thermosoftening or thermosetting plastic material (e.g. polycarbonate (PC), polymethylmethacrylate (PMMA), epoxy resin, or the like). The plastic part 200 is generally of U-shape in sectional view, and it is provided on the first face 101 of the sheet 100. The plastic part 200 has first and second faces 201, 202 in the thickness direction D1. As the plastic part 200 is formed on the first face 101 of the sheet 100, the sheet 100 generally adheres to or is integrated with the plastic part 200 and has hardened (has lost flexibility) generally in a U-shaped curve extending along the second face 202 of the plastic part 200. The second face 102 of the sheet 100 has a flat central portion serving as a touch sensing surface of the device module.

The touch sensor 300 is a capacitive touch panel of generally rectangular shape and in rigid or flexible sheet form. The touch sensor 300 can detect a detection object such as a finger that touches the touch sensing surface of the sheet 100. The touch sensor 300 is fixed to a central portion of the first face 101 of the sheet 100 and embedded in the plastic part 200. The touch sensor 300 extends substantially parallel to the touch sensing surface of the sheet 100.

If the touch sensor 400 is in a rigid transparent sheet form, it may have any one of the configurations (1) to (3) indicated below. If the touch sensor 400 is in a flexible transparent sheet form (if it is a film sensor), it may have any one of the configurations (4) to (6) indicated below.

1) The touch sensor 300 includes a first transparent substrate having first and second faces in its thickness direction D1, a plurality of first transparent electrodes provided on the first face of the first transparent substrate, and a plurality of second transparent electrodes provided on the second face of the first transparent substrate.
2) The touch sensor 300 includes a first transparent substrate, a plurality of first transparent electrodes provided on the first transparent substrate, an insulating layer provided on the first transparent substrate so as to cover the first transparent electrodes, and a plurality of second transparent electrodes provided on the insulating layer.
3) The touch sensor 300 includes a first transparent substrate having a first face, a second transparent substrate having a first face opposed to the first face of the first transparent substrate, a plurality of first transparent electrodes provided on the first face of the first transparent substrate, and a plurality of second transparent electrodes provided on the first face of the second transparent substrate.
4) The touch sensor 300 includes a flexible insulating first transparent film having first and second faces in its thickness direction D1, a plurality of first transparent electrodes provided on the first face of the first transparent film, and a plurality of second transparent electrodes provided on the second face of the first transparent film.
5) The touch sensor 300 includes a flexible insulating first transparent film, a plurality of first transparent electrodes provided on the first transparent film, a flexible insulating second transparent film provided on the first transparent film so as to cover the first transparent electrodes, and a plurality of second transparent electrodes provided on the second transparent film.
6) The touch sensor 300 includes a flexible insulating first transparent film having a first face, a flexible insulating second transparent film having a first face opposed to the first face of the first transparent film, a plurality of first transparent electrodes provided on the first face of the first transparent film, and a plurality of second transparent electrodes provided on the first face of the second transparent film.

The external connection 400 is flexible. Specifically, the external connection 400 is a flexible printed circuit or a flexible insulating transparent film. The external connection 400 has an embedded portion 410 and a lead-out portion 420. The embedded portion 410 is embedded in the plastic part 200 of the external connection 400 and fixed to the central portion of the first face 101 of the sheet 100. The embedded portion 410 includes a lengthwise first end of the external connection 400. The lead-out portion 420 is a portion excluding the embedded portion 410 of the external connection 400. The lead-out portion 420 includes a lengthwise second end of the external connection 400.

If the external connection 400 is a flexible printed circuit, the first end of the external connection 400 is connected to at least one of the first and second transparent substrates of the touch sensor 300, or to at least one of the first and second transparent films of the touch sensor 300. Such flexible printed circuit includes a plurality of conductive lines connected to first and second transparent electrodes. If the external connection 400 is a transparent film, the first end of the external connection 400 is integrally connected to at least one of the first and second transparent substrates of the touch sensor 300, or to at least one of the first and second transparent films of the touch sensor 300. Such transparent film includes a plurality of conductive lines connected to the first and second transparent electrodes.

The holder 500 is a truncated conical block made of the same plastic material or a plastic material of the same group as the plastic part 200 (for example, polycarbonate (PC), polymethylmethacrylate (PMMA), epoxy resin, or the like). The holder 500 includes a base 510, an exposed portion 520, and a through hole 530. The base 510 is the basal portion of the holder 500 and is embedded in the plastic part 200. The base 510 includes a mounted portion 511 and an unmounted portion 512. The mounted portion 511 is mounted on a part of the embedded portion 410 on the first face 101 of the sheet 100. That is, the sheet 100, the embedded portion 410, and the holder 500 are stacked in this order. The unmounted portion 512 of the base 510 is disposed leaving a gap from the first face 101 of the sheet 100. The gap is filled with plastic material of the plastic part 200.

The exposed portion 520 is the distal portion of the holder 500 continuously connected to the base 510, and it protrudes (is exposed) from the first face 201 of the plastic part 200 to one side in the thickness direction D1 (upward in FIG. 1). The exposed portion 520 is tapered.

The through hole 530 is a rectangular through hole passing through the holder 500 in the thickness direction D1 (passing through from the bottom face of the base 510 to the top face (distal face) of the exposed portion 520). The dimensions of the through hole 530 (dimensions in the lengthwise direction D2 and the short direction) are slightly larger than the outer dimensions of the lead-out portion 420 of the external connection 400 (dimensions in the lengthwise direction D2 and the short direction of the lead-out portion 420 as oriented in the thickness direction D1). The lead-out portion 420 extends through the through hole 530 and is led out of the through hole 530 to the one side in the thickness direction D1.

Figure 2:
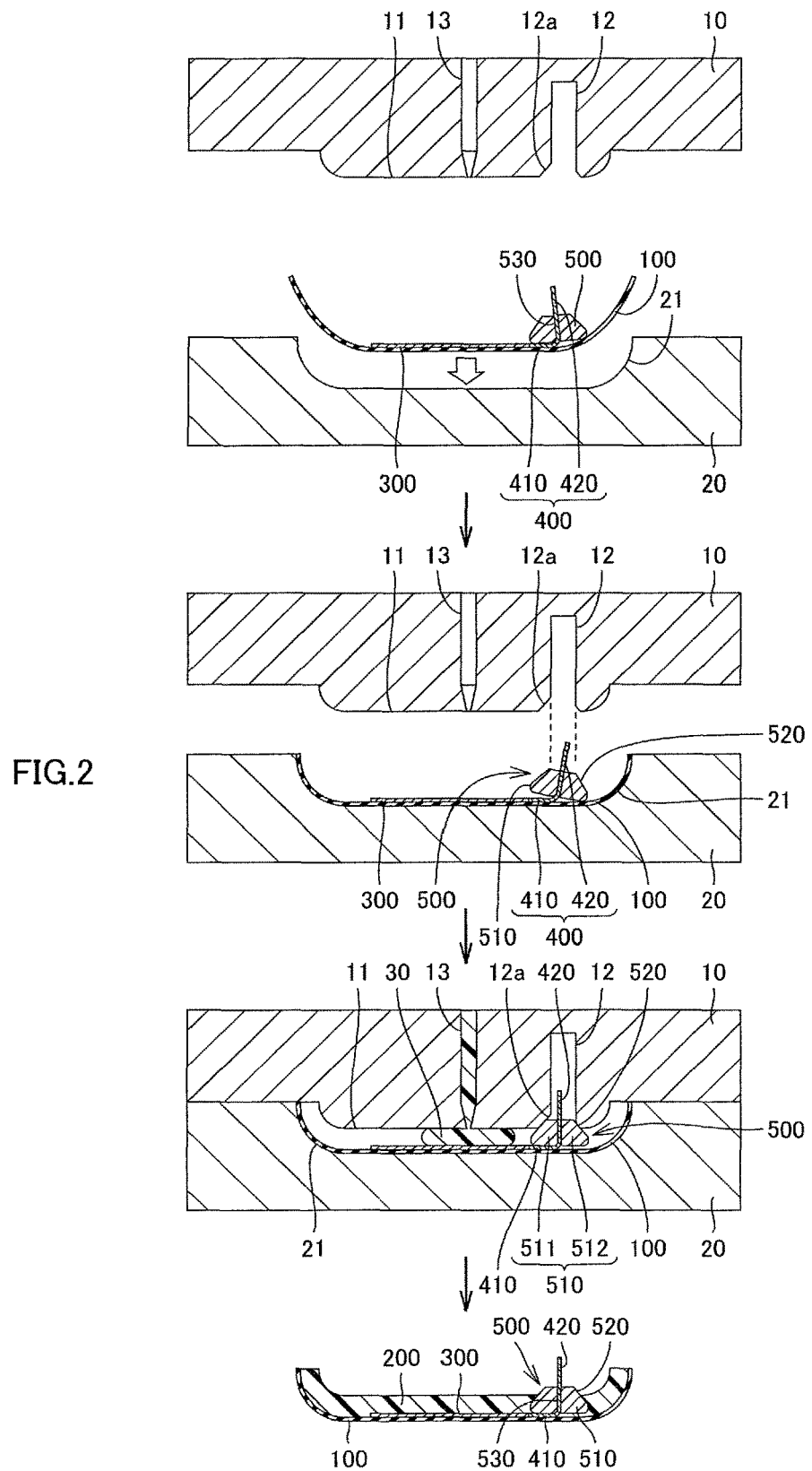
FIG. 2 is a view illustrating a process of manufacturing the device module.

The device module above described may be manufactured using first and second dies 10, 20 as illustrated in FIG. 2. The first die 10 includes a projection 11, a housing recess 12, and a sprue 13. The projection 11 projects in the thickness direction D1 toward the second die 20. The sprue 13 passes through the first die 10 in the thickness direction D1. The housing recess 12 of the first die 10 open from a distal end face of the projection 11. The edge of the housing recess 12 partly forms a tapered portion 12a (the left part of the edge in FIG. 2). The distance between the tapered portion and the opposed portion of the edge gradually increases toward the open side of the housing recess 12. The housing recess 12 has dimensions on the open side (dimensions in the lengthwise direction D2 and the short direction) larger than the outer dimensions (dimensions in the lengthwise direction D2 and the short direction) of the distal end of the exposed portion 520 of the holder 500 and smaller than the outer dimensions (dimensions in the lengthwise direction D2 and the short direction) of the base 510 of the holder 500. The portion excluding the open side of the housing recess 12 has dimensions (dimensions in the lengthwise direction D2 and the short direction) larger than the outer dimensions of the lead-out portion 420 (dimensions in the lengthwise direction D2 and the short direction of the lead-out portion 420 as oriented in the thickness direction D1). The housing recess 12 has a dimension in the thickness direction D1 larger than the length of the portion of the lead-out portion 420 that is led out of the holder 500. The second die 20 has a recess 21 adapted to receive the projection 11. The recess 21 has a dimension in the thickness direction D (i.e. depth) larger than the dimension in the thickness direction D (i.e. height) of the projection 11. The recess 21 and the projection 11 received in the recess 21 define a space. This space serves as a cavity of the combined first and second dies 10, 20. The shape of the cavity conforms to the outer shape of the device module excluding the lead-out portion 420 and the exposed portion 520.

A method of manufacturing the device module using the first and second dies 10, 20 will be described below with reference to FIG. 2. A skilled person would appreciate that the embedded portion 410 corresponds to the first end portion of the external connection as defined in the claims, and the lead-out portion 420 corresponds to the second end portion of the external connection as defined in the claims.

The first step is to prepare the sheet 100 and prepare the touch sensor 300 with the external connection 400 connected thereto. The touch sensor 300 and the embedded portion 410 of the external connection 400 are fixed to the first face 101 of the sheet 100 with an adhesive. Also prepared is the holder 500. The lead-out portion 420 of the external connection 400 is inserted through the through hole 530 of the holder 500. The lead-out portion 420 is thus partially fixed to the holder 500 and partially led out of the holder 500. It should be noted that the connection between the touch sensor 300 and the external connection 400 may be established after the insertion of the lead-out portion 420 through the through hole 530. Also, the touch sensor 300 and the embedded portion 410 of the external connection 400 may be fixed to the first face 101 of the sheet 100 with an adhesive after the insertion of the lead-out portion 420 through the through hole 530.

Then, the sheet 100, touch sensor 300, the external connection 400, and the holder 500 are placed into the recess 21 of the second die 20. This causes the sheet 100 to curve generally in a U-shape in sectional view conforming to the shape of the recess 21. At this stage, the holder 500 is aligned with the plumb line of the housing recess 12 of the first die 10.

Then, first and second dies 10, 20 are brought close to each other, and the projection 11 of the first die 10 is inserted into the recess 21 of the second die 20 (i.e. the first and second dies 10, 20 are closed). This creates the cavity between the projection 11 and the recess 21. The sheet 100, the touch sensor 300, the embedded portion 410 of the external connection 400, and the base 510 of the holder 500 are placed in the cavity. At this point, the lead-out portion 420 of the external connection 400 is inserted into the housing recess 12 of the first die 10, and the exposed portion 520 of the holder 500 fits in the housing recess 12 so as to block the housing recess 12. The tapered exposed portion 520 and the tapered portion 12a of the housing recess 12 guide the exposed portion 520 such that the exposed portion 520 fits in the housing recess 12. When the exposed portion 520 fits in the housing recess 12, the mounted portion 511 of the holder 500 is mounted on the embedded portion 410 of the external connection 400. As a result, the holder 500 is securely held between the first die 10 and the second die 20 via the sheet 100 and the embedded portion 410, creating a gap between the unmounted portion 512 of the holder 500 and the sheet 100.

Then, plastic material 30 is injected through the sprue 13 of the first die 10 onto the sheet 100 into the cavity. The cavity is filled with the plastic material 30, so that the touch sensor 300, the embedded portion 410 of the external connection 400, and the base 510 of the holder 500 are embedded in the plastic material 30 on the sheet 100. At this point, the plastic material 30 also flows into the gap. Then, the plastic material 30 hardens. The hardened plastic material 30 becomes the plastic part 200. At this point, the sheet 100 gets adhered to or integrated with the plastic part 200 and hardens.

Then, the first and second dies 10, 20 are separated from each other to take out the exposed portion 520 of the holder 500 and the lead-out portion 420 of the external connection 400 from the housing recess 12 of the first die 10. This is how to insert-molded the touch sensor 300, the embedded portion 410 of the external connection 400, and the base 510 of the holder 500 in the plastic part 200 on the sheet 100. The exposed portion 520 of the holder 500 protrudes from the plastic part 200 to the one side in the thickness direction D1. The lead-out portion 420 protrudes from the holder 500 to the one side in the thickness direction D1.

The above described device module has at least the following technical features and advantages. First, it is possible to block the housing recess 12 of the first die 10 during the insert molding process, by inserting the lead-out portion 420 of the external connection 400 into the housing recess 12 and fitting the exposed portion 520 of the holder 500 in the housing recess 12. It is thus possible to prevent the ingress of the plastic material 30 into the housing recess 12 of the first die 10 during the insert molding process. In other words, the exposed portion 520 is configured to block (close) the housing recess 12 to prevent the ingress of the plastic material 30 into the housing recess 12 of the first die 10. This configuration makes it possible to size the housing recess 12 such as to readily receive the lead-out portion 420. Therefore, it is possible to place the lead-out portion 420 readily into the housing recess 12 during the insert molding process (when closing the first and second dies 10, 20).

Further advantageously, the holder 500 is securely held during the insert molding process, between the first die 10 and the second die 20 via the sheet 100 and the embedded portion 410. This arrangement reduces the possibility of movement of the holder 500 and the external connection 400 fixed thereto even when the holder 500 is pressed by the plastic material 30 injected into the cavity. Further, the gap between the holder 500 and the sheet 100 is filled with the plastic material of the plastic part 200, so that the outer shape of the holder 500 is unlikely to appear on the sheet 100. This improves the surface accuracy of the portion of the sheet 100 opposed to the holder. Further, the holder 500 is made of the same plastic material as the plastic part 200 or of a plastic material of the same group as the plastic part 200, the holder 500 is integrated with the plastic part 200. Thus, the holder 500 is visually unobtrusive when seen through the plastic part 200, thereby enhancing the aesthetic appearance of the device module.

Second Embodiment

Figure 3:
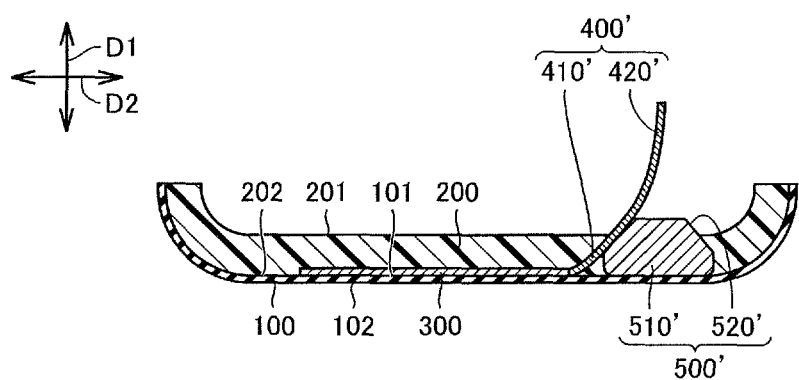
FIG. 3 is a schematic sectional view showing a device module in accordance with the Second Embodiment of the invention.

Next, a device module in accordance with the Second Embodiment of the invention will be described with reference to FIG. 3. The device module as shown in FIG. 3 is different from that of the First Embodiment in the configurations of a holder 500', and in that a lead-out portion 420' of an external connection 400' is fixed to an outer face of the holder 500'. These differences will be described below in detail, and overlapping descriptions will be omitted. A symbol is added to the reference numerals of the holder and the external connection in this embodiment to distinguish them from those of the First Embodiment.

The holder 500' is a truncated conical block made of the same plastic material or a plastic material of the same group as the plastic part 200 (for example, polycarbonate (PC), polymethylmethacrylate (PMMA), epoxy resin, or the like). The holder 500' includes a base 510' and an exposed portion 520'. The base 510' is the basal portion of the holder 500'. The base 510' is mounted on the first face 101 of the sheet 100 and embedded in the plastic part 200. The exposed portion 520' is the distal portion of the holder 500' continuously connected to the base 510' and protrudes (is exposed) from the first face 201 of the plastic part 200 to the one side in the thickness direction D1 (upward in FIG. 3). The exposed portion 520' is tapered.

The external connection 400' generally has the same configuration as the external connection 400. The only difference is that the external connection 400' is partially fixed to the outer face of the holder 500'. The external connection 400' has an embedded portion 410' and a lead-out portion 420'. The embedded portion 410' is partially fixed to an outer face (circumferential face) of the base 510' of the holder 500' with an adhesive or other means. The lead-out portion 420' is partially fixed to the outer face (circumferential face) of the exposed portion 520' of the holder 500' and led out of the first face 201 of the plastic part 200 to the one side in the thickness direction D1 (upward in FIG. 3).

This device module may be manufactured by the following method using the first and second dies 10, 20 described above for the First Embodiment. A skilled person would appreciate that the embedded portion 410' corresponds to the first end portion of the external connection as defined in the claims, and the lead-out portion 420' corresponds to the second end portion of the external connection as defined in the claims.

The first step is to prepare the touch sensor 300 with the external connection 400' connected thereto and the holder 500'. A part of the external connection 400' (a part of the embedded portion 410' and a part of the lead-out portion 420') is fixed to the outer face of the holder 500' (outer faces of the base 510' and the exposed portion 520') with an adhesive or other means. Also prepared is the sheet 100. The touch sensor 300 is fixed to the first face 101 of the sheet 100 with an adhesive, and the holder 500' is mounted on the first face 101 of the sheet 100. The holder 500' may alternatively be adhered to the first face 101 of the sheet 100.

Then, the sheet 100, the touch sensor 300, the external connection 400', and the holder 500' are placed into the recess 21 of the second die 20. This causes the sheet 100 to curve generally in a U-shape in sectional view conforming to the shape of the recess 21. At this stage, the holder 500' is aligned with the plumb line of the housing recess 12 of the first die 10.

Then, the first and second dies 10, 20 are brought close to each other, and the projection 11 of the first die 10 is inserted into the recess 21 of the second die 20 (i.e. the first and second dies 10, 20 are closed). This creates the cavity between the projection 11 and the recess 21. The sheet 100, the touch sensor 300, the embedded portion 410' of the external connection 400', and the base 510' of the holder 500' are placed in the cavity. At this point, a portion of the lead-out portion 420' that is not fixed to the holder 500' (unfixed portion) is inserted into the housing recess 12 of the first die 10, and the housing recess 12 fittingly receives the exposed portion 520' of the holder 500' and the portion of the lead-out portion 420' that is fixed to the exposed portion 520' (fixed portion), so that the housing recess 12 is blocked up. The tapered exposed portion 520' and the tapered portion 12a of the housing recess 12 guide the exposed portion 520' and the fixed portion of the lead-out portion 420' such that the exposed portion 520' and the fixed portion of the lead-out portion 420' fit in the housing recess 12. When the exposed portion 520' and the fixed portion of the lead-out portion 420' fit in the housing recess 12, the holder 500' is securely held between the first die 10 and the second die 20 via the sheet 100.

Then, plastic material is injected through the sprue 13 of the first die 10 onto the sheet 100 in the cavity. The cavity is filled with the plastic material, so that the touch sensor 300, the embedded portion 410' of the external connection 400', and the base 510' of the holder 500' are embedded in the plastic material on the sheet 100. At this point, the plastic material also flows into the gap. Then, the plastic material hardens. The hardened plastic material becomes the plastic part 200. At this point, the sheet 100 gets adhered to or integrated with the plastic part 200 and hardens.

Then, the first and second dies 10, 20 are separated from each other to take out the exposed portion 520' of the holder 500' and the lead-out portion 420' of the external connection 400' from the housing recess 12 of the first die 10. This is how to insert-molded the touch sensor 300, the embedded portion 410' of the external connection 400', and the base 510' of the holder 500' in the plastic part 200 on the sheet 100. The exposed portion 520' of the holder 500' protrudes and is exposed from the plastic part 200 to the one side in the thickness direction D1. The lead-out portion 420' of the external connection 400' is led out of the plastic part 200 to the one side in the thickness direction D1.

The above described device module has at least the following technical features and advantages. First, it is possible to block the housing recess 12 of the first die 10 during the insert molding process, by inserting the unfixed portion of the lead-out portion 420' of the external connection 400' into the housing recess 12 and fitting the exposed portion 520' of the holder 500' and the fixed portion of the lead-out portion 420' into the housing recess 12. It is thus possible to prevent the ingress of the plastic material into the housing recess 12 of the first die 10 during the insert molding process. In other words, the exposed portion 520' and the fixed portion of the lead-out portion 420' are configured to block (close) the housing recess 12 to prevent the ingress of the plastic material into the housing recess 12 of the first die 10. This makes it possible to size the housing recess 12 such as to readily receive the lead-out portion 420'. Therefore, it is possible to place the lead-out portion 420' readily into the housing recess 12 during the insert molding process (when closing the first and second dies 10, 20).

Further advantageously, the holder 500' is securely held during the insert molding process, between the first die 10 and the second die 20 via the sheet 100. This arrangement reduces the possibility of movement of the holder 500' and the external connection 400' fixed thereto even when the holder 500 is pressed by the plastic material injected into the cavity. Further, the holder 500' is made of the same plastic material as the plastic part 200 or of a plastic material of the same group as the plastic part 200, the holder 500' is integrated with the plastic part 200. Thus, the holder 500' is visually unobtrusive when seen through the plastic part 200, thereby enhancing the aesthetic appearance of the device module. In addition, as the holder 500' to be integrated with the plastic part 200 is mounted on the sheet 100, the sheet 100 is less likely to have a sink mark.

Third Embodiment

Figure 4:
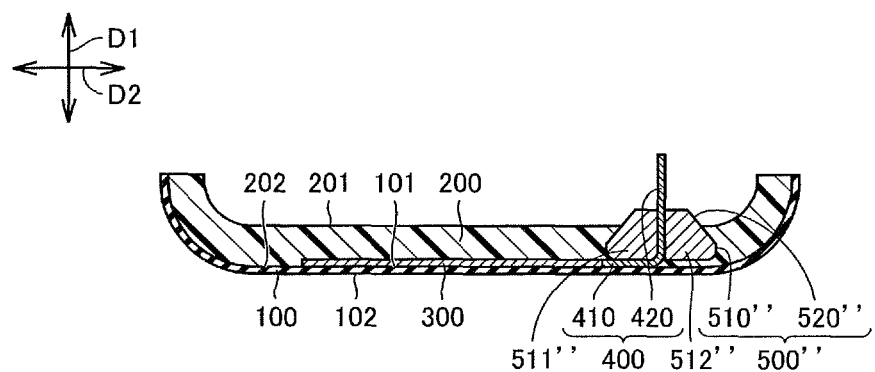
FIG. 4 is a schematic sectional view showing a device module in accordance with the Third Embodiment of the invention.

Next, a device module in accordance with the Third Embodiment of the invention will be described with reference to FIG. 4. The device module as shown in FIG. 4 is different from that of the First Embodiment in that the lead-out portion 420 of the external connection 400 is embedded in a holder 500" by insert molding. These differences will be described below in detail, and overlapping descriptions will be omitted. A symbol _"_ is added to the reference numerals of the holder in this embodiment to distinguish them from that of the First Embodiment.

The holder 500" generally has the same configuration as the holder 500. The only difference is that the holder 500" has no through hole 530. As shown in FIG. 4, the holder 500" includes a base 510" and an exposed portion 520", and the base 510" includes a mounted portion 511" and an unmounted portion 512". The lead-out portion 420 of the external connection 400 is partially embedded in the holder 500" so as to pass from the bottom face of the base 510" of the holder 500" to the top face (distal face) of the exposed portion 520".

The lead-out portion 420 of the external connection 400 may be embedded in the holder 500" in the following method using a die (not shown). First, the external connection 400 is prepared. The external connection 400 may or may not be connected to the touch sensor 300. A part of the lead-out portion 420 of the external connection 400 is placed in the die, into which plastic material is injected. As a result, the lead-out portion 420 of the external connection 400 is partially embedded (insert-molded) in the holder 500" and passes from the bottom face of the base 510" of the holder 500" to the top face of the exposed portion 520". As in the First Embodiment, the external connection 400 with the holder 500" is placed in the cavity of the first and second dies 10, 20 to manufacture the device module.

This device module can achieve the same effects as those in the First Embodiment.

Fourth Embodiment

Figure 5A:
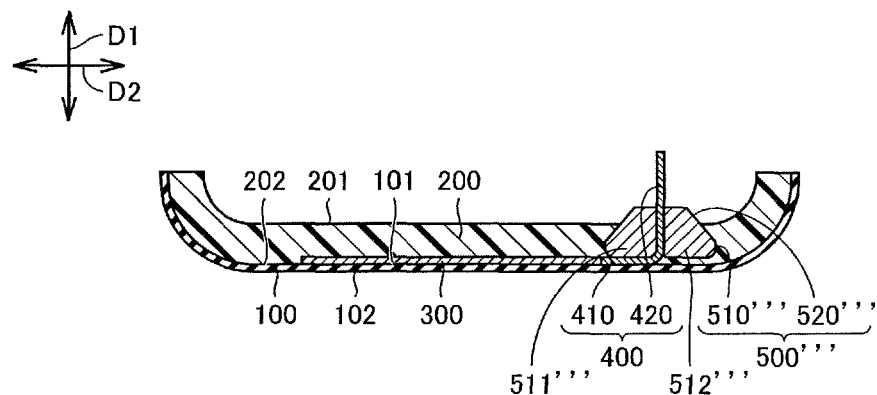
FIG. 5A is a schematic sectional view showing a device module in accordance with the Fourth Embodiment of the invention.

Next, a device module in accordance with the Fourth Embodiment of the invention will be described with reference to FIG. 5A. The device module as shown in FIG. 5A is different from that of the First Embodiment in that the holder 500''' consists of pieces 501''', 502''' that surround a part of the lead-out portion 420 of the external connection 400. The difference will be described below in detail, and overlapping descriptions will be omitted. symbol _'''_ is added to the reference numerals of the holder in this embodiment to distinguish them from those of the First Embodiment.

Figure 5B:
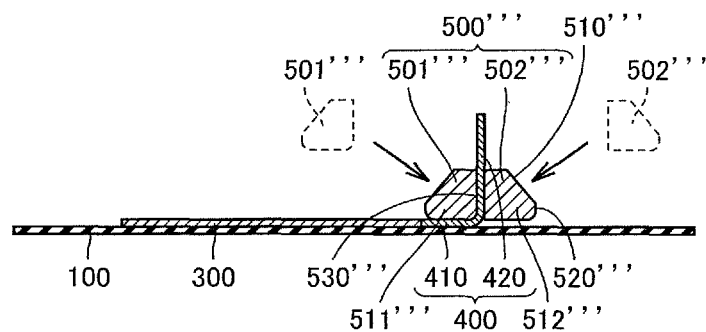
FIG. 5B is a schematic sectional view showing a process of fixing a holder to an external connection in a method of manufacturing the device module.

The holder 500''' includes the pieces 501''', 502'''. The pieces 501''', 502''' are made of the same plastic material or a plastic material of the same group as the plastic part 200 (for example, polycarbonate (PC), polymethylmethacrylate (PMMA), epoxy resin, or the like). The pieces 501''', 502''' are combined with each other to have a truncated conical shape similar to that of the holder 500. The inner face of the piece 501''' has a long groove 530''' extending in the thickness direction D1. The dimensions of the long groove 530''' (dimensions in the lengthwise direction D2 and the short direction) are slightly larger than the dimensions of the lead-out portion 420 of the external connection 400 (dimensions in the lengthwise direction D2 and the short direction of the lead-out portion 420 as oriented in the thickness direction D1). When the pieces 501''', 502''' are combined, the long groove 530''' is covered with the piece 502''' and ready to receive the lead-out portion 420 therethrough. In other words, a part of the lead-out portion 420 is surrounded by the pieces 501''', 502'''. The holder 500''' includes a base 510''' and an exposed portion 520''', and the base 510''' includes a mounted portion 511''' and an unmounted portion 512''', as shown in FIG. 5A and FIG. 5B. These constituents have the same configurations as those of the holder 500.

The lead-out portion 420 of the external connection 400 may be fixed to the holder 500''' in the steps as described below with reference to FIG. 5B. The first step is to prepare the touch sensor 300 with the external connection 400 connected thereto. The touch sensor 300 and the embedded portion 410 of the external connection 400 are fixed to the first face 101 of the sheet 100 with an adhesive. Also prepared are the pieces 501''', 502'''. A part of the lead-out portion 420 is inserted into the long groove 530''' of the piece 501'''. Then, the piece 502''' is combined with the piece 501''' to cover the long groove 530''' of the piece 501''' with the piece 502'''. The pieces 501''', 502''' are now combined with each other surrounding the part of the lead-out portion 420 of the external connection 400. As in the First Embodiment, the external connection 400 with the holder 500''' is placed in the cavity of the first and second dies 10, 20 to manufacture the device module. It should be noted that the step of combining the pieces 501''', 502''' surrounding the lead-out portion 420 may be followed by the step that the touch sensor 300 and the embedded portion 410 of the external connection 400 are fixed to the first face 101 of the sheet 100 with an adhesive.

Such device module can achieve the same effects as those in the First Embodiment. Moreover, the holder 500''' is fixed to the part of the lead-out portion 420 of the external connection 400 by combining the pieces 501''', 502''' so as to surround the part of the lead-out portion 420. It is thus possible to improve the workability of fixing the holder 500''' to the external connection 400.

Fifth Embodiment

Figure 6:
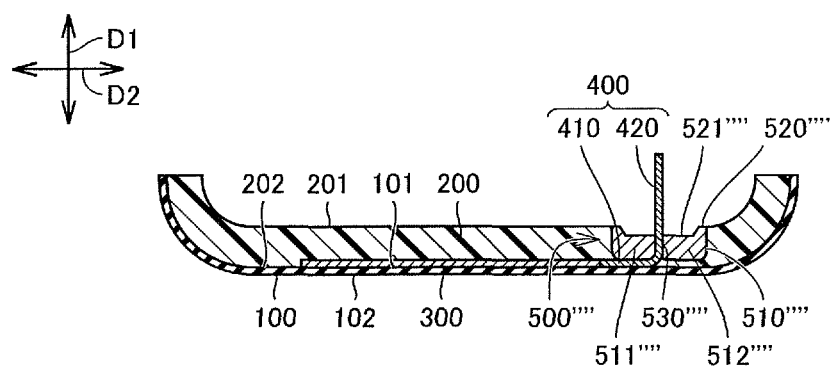
FIG. 6 is a schematic sectional view showing a device module in accordance with the Fifth Embodiment of the invention.
Figure 7:
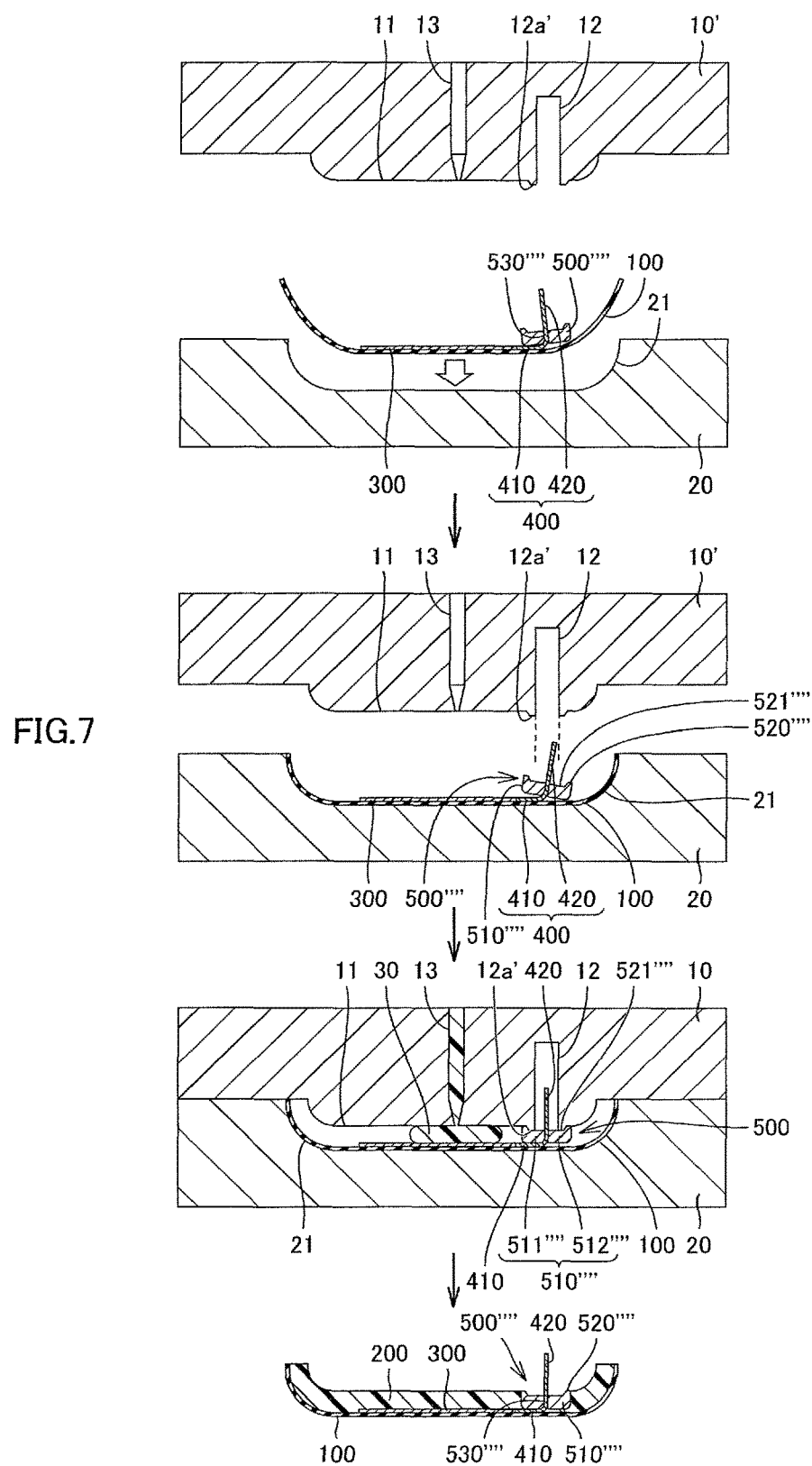
FIG. 7 is a view for illustrating a process of manufacturing the device module.

Next, a device module in accordance with the Fifth Embodiment of the invention will be described with reference to FIG. 6 and FIG. 7. The device module as shown in FIG. 6 generally has the same configuration as that of the First Embodiment but includes a holder 500'''' of a different shape from that of the holder 500. This difference will be described below in detail, and overlapping descriptions will be omitted. A symbol _''''_ is added to the reference numerals of the holder in this embodiment to distinguish them from those of the First Embodiment.

The holder 500'''' is made of the same plastic material or a plastic material of the same group as the plastic part 200 (for example, polycarbonate (PC), polymethylmethacrylate (PMMA), epoxy resin, or the like). The holder 500'''' is different from the holder 500 in that it includes an exposed portion 520'''' that does not protrude from the first face 201 of the plastic part 200 to the one side in the thickness direction D1 (upward in FIG. 6).

The exposed portion 520'''' has an exposed face and a fitting recess 521''''. The exposed face of the exposed portion 520'''' faces the one side in the thickness direction D1 (upward in FIG. 6) and is not hidden behind the first face 201 of the plastic part 200. The central area of the exposed face around the through hole 530'''' is dented to form the fitting recess 521''''. The fitting recess 521'''' is of shape conforming to the outer shape of a fitting projection 12a' of a first die 10' (to be described, see FIG. 7). The holder 500'''' further includes a base 510'''', which includes a mounted portion 511'''' and an unmounted portion 512'''' as shown in FIG. 6.

The device module of this embodiment may be manufactured using the modified first die 10', in place of the first die 10, as described below with reference to FIG. 7. The first die 10' includes the annular fitting projection 12a' provided along the edge of the housing recess 12. In the state where the projection 11 of the first die 10' is inserted into the recess 21 of the second die 20, the projection 11 and the recess 21 define a space. The space serves as a cavity of the combined first and second dies 10', 20. The shape of the cavity conforms to the outer shape of the device module excluding the lead-out portion 420.

A method of manufacturing the device module using the first and second dies 10', 20 will be described with reference to FIG. 7. A skilled person would appreciate that the embedded portion 410 corresponds to the first end portion of the external connection as defined in the claims, the lead-out portion 420 corresponds to the second end portion of the external connection as defined in the claims.

The first step is to prepare the sheet 100, and the touch sensor 300 with the external connection 400 connected thereto. The touch sensor 300 and the embedded portion 410 of the external connection 400 are fixed to the first face 101 of the sheet 100 with an adhesive. Also prepared is the holder 500'''', and the lead-out portion 420 of the external connection 400 is inserted through the through hole 530'''' of the holder 500''''. The lead-out portion 420 is thus partially fixed to the holder 500'''' and partially led out of the holder 500''''. It should be noted that the connection between the touch sensor 300 and the external connection 400 may be established after the insertion of the lead-out portion 420 through the through hole 530''''. Also, the touch sensor 300 and the embedded portion 410 of the external connection 400 may be fixed to the first face 101 of the sheet 100 with an adhesive after the insertion of the lead-out portion 420 through the through hole 530''''.

Then, the sheet 100, the touch sensor 300, the external connection 400, and the holder 500'''' are placed into the recess 21 of the second die 20. This causes the sheet 100 to curve generally in a U-shape in sectional view conforming to the shape of the recess 21. At this stage, the holder 500'''' is aligned with the plumb line of the housing recess 12 of the first die 10'.

Then, the first and second dies 10', 20 are brought close to each other, and the projection 11 of the first die 10' is inserted into the recess 21 of the second die 20 (i.e. the first and second dies 10', 20 are closed). This creates the cavity between the projection 11 and the recess 21. The sheet 100, the touch sensor 300, the embedded portion 410 of the external connection 400, and the holder 500"" are placed in the cavity. At this point, the lead-out portion 420 of the external connection 400 is inserted into the housing recess 12 of the first die 10', and the fitting projection 12a' of the first die 10' fits in the fitting recess 521"" of the exposed portion 520"" of the holder 500"". The exposed portion 520"" thus covers the housing recess 12. When the fitting projection 12a' fits in the fitting recess 521"", the mounted portion 511"" of the holder 500"" is mounted on the embedded portion 410 of the external connection 400. As a result, the holder 500"" is securely held between the first die 10' and the second die 20 via the sheet 100 and the embedded portion 410, creating a gap between the unmounted portion 512"" of the holder 500"" and the sheet 100.

Then, the plastic material 30 is injected through the sprue 13 of the first die 10' onto the sheet 100 in the cavity. The cavity is filled with the plastic material 30, so that the touch sensor 300, the embedded portion 410 of the external connection 400, and the holder 500"" are embedded in the plastic material 30 on the sheet 100. At this point, the plastic material 30 also flows into the gap. Then, the plastic material 30 hardens to become the plastic part 200. At this point, the sheet 100 adheres to or is integrated with the plastic part 200 and hardens.

Then, when the first and second dies 10', 20 are separated from each other to take out the lead-out portion 420 of the external connection 400 from the housing recess 12 of the first die 10' and disengage the fitting projection 12a' of the first die 10' from the fitting recess 521"" of the holder 500"". This is how to insert-molded the touch sensor 300, the embedded portion 410 of the external connection 400, and the holder 500"" in the plastic part 200 on the sheet 100. The exposed portion 520"" of the holder 500"" is exposed from the plastic part 200, facing the one side in the thickness direction D1. The lead-out portion 420 is led out of the holder 500"" to the one side in the thickness direction D1.

The above described device module has at least the following technical features and advantages. First, during the insert molding process, the lead-out portion 420 of the external connection 400 enters the housing recess 12 of the first die 10', while the fitting projection 12a' of the first die 10' fits in the fitting recess 521"" of the exposed portion 520"" of the holder 500"". This arrangement makes it possible to cover the housing recess 12 of the first die 10' with the exposed portion 520'" so as to prevent the ingress of the plastic material 30 into the housing recess 12 of the first die 10' during the insert molding process. In other words, the exposed portion 520"" is configured to cover (close) the housing recess 12 to prevent the ingress of the plastic material 30 into the housing recess 12 of the first die 10'. This configuration makes it possible to size the housing recess 12 such as to readily receive the lead-out portion 420. Therefore, it is possible to place the lead-out portion 420 easily into the housing recess 12 during the insert molding process (when closing the first and second dies 10', 20).

Further advantageously, the holder 500"" is securely held during the insert molding process, between the first die 10' and the second die 20 via the sheet 100 and the embedded portion 410. This arrangement reduces the possibility of movement of holder 500"" and the external connection 400 fixed thereto even when the holder 500"" is pressed by the plastic material 30 injected into the cavity. Further, the gap between the holder 500"" and the sheet 100 is filled with the plastic material of the plastic part 200, so that the outer shape of the holder 500"" is unlikely to appear on the sheet 100. This improves the surface accuracy of the portion of the sheet 100 opposed to the holder 500"". Further, the holder 500"" is made of the same plastic material as the plastic part 200 or of a plastic material of the same group as the plastic part 200, the holder 500"" is integrated with the plastic part 200. Thus, the holder 500"" is visually unobtrusive when seen through the plastic part 200, thereby enhancing the aesthetic appearance of the device module.

Figure 8:
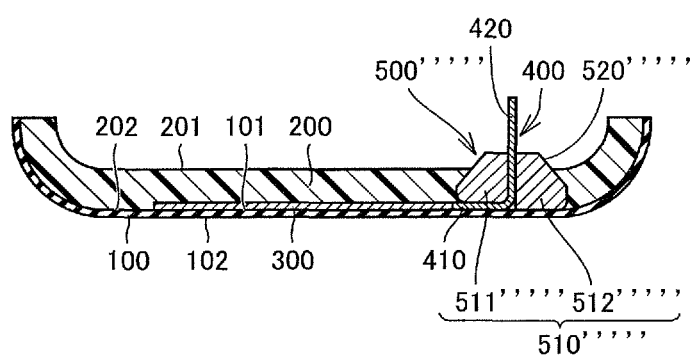
FIG. 8 is a schematic sectional view showing a device module in accordance with an example modification of the First Embodiment.

The device module of the invention is not limited to the embodiments as described above and may be modified in any manner within the scope of claims. Specific modifications will be described below in detail. FIG. 8 is a schematic sectional view showing a device module in accordance with an example modification of the First Embodiment.

The holder of the First to Third and Fifth Embodiments is a plastic block. The holder of the Forth Embodiment has a plurality of plastic pieces. However, the holder may be modified in any manner as long as it is partially fixed to the external connection and embedded in the plastic part and as long as a part (the exposed portion) of the holder is exposed from the plastic part in the thickness direction of the plastic part in such a manner as to close of the housing recess of the die. The holder may be made of any other plastic material (e.g. elastomer), metal, or ceramic. Alternatively, the holder may be a film coating or an adhesive fixed to the part of the external connection.

The exposed portion of the holder of the First to Fourth Embodiments is tapered and protrudes from the plastic part. The exposed portion of the Fifth Embodiment is exposed from the plastic part and has the exposed face with the fitting recess. However, the exposed portion may be of any shape as long as a part of the exposed portion is exposed from the plastic part in the thickness direction of the plastic part in such a manner as to close the housing recess of the die. For example, the exposed portion of the holder may be modified to have a flat exposed face exposed from the first face of the plastic part in the thickness direction. In this case, the exposed face of the exposed portion of the holder may be flush with the first face of the plastic part. That is, the exposed portion of the holder may not protrude from the first face of the plastic part. This modified exposed portion is exposed from the plastic part in such a manner as to not fit in the housing recess of the first die but close the housing recess. The exposed portion may be modified to have a cylindrical, conical, or semi-spherical shape that can fit in the housing recess of the die. The exposed portion need not be entirely tapered and may be partially tapered. Further, the fitting recess of the exposed portion may be modified in any manner as to fit over the fitting projection of the first die and close the housing recess of the first die. The fitting recess may be provided in the exposed portion protruding from the plastic part. The base of the holder may be of any shape adapted to be embedded in the plastic part.

The invention is not limited to the configuration in accordance with the First, Third and Fifth Embodiments that a gap is created between the unmounted portion of the holder and the sheet. FIG. 8 illustrates an example modification wherein a holder 500"''' includes a base 510"''' and an exposed portion 520"'''. The base 510"''' includes a first mounted portion 511"''' and a second mounted portion 512"'''. The first mounted portion 511"''' is mounted on the embedded portion 410 as in the mounted portion 511. The second mounted portion 512"''' extends further than the first mounted portion 511"''' to the other side in the thickness direction D1 (downward) to be mounted on the first face 101 of the sheet 100. The second mounted portion 512"''' may be fixed to the first face 101 of the sheet 100. The holder 500''' of the Fourth Embodiment may also include the second mounted portion 512"" in place of the unmounted portion 512'". The holder 500"" of the Fifth Embodiment may also include the second mounted portion 512"" in place of the unmounted portion 512"".

The holder may include two pieces as in the Fourth Embodiment or may have three pieces or more. Further, the long groove may be provided in one of the pieces as in the Fourth Embodiment or may be provided in a plurality of pieces. In the latter case, the long groove extending in the combined pieces serves as a hole to receive the lead-out portion of the external connection. The long groove may be omitted. In this case, the pieces as combined may have a hole therebetween to receive the lead-out portion of the external connection. The holder of the modifications described above and the holder 500"" of the Fifth Embodiment may be modified to have a plurality of pieces as described above.

The external connection may include an embedded portion and a lead-out portion as in the First to Fifth Embodiments and the modifications described above. However, the external connection may be modified in any manner as long as it satisfies the following requirements. The first requirement is that the external connection is connected to a device to be described. The second requirement is that the external connection is partially fixed to the holder. The third requirement is that the external connection includes a lead-out portion insertable in a housing recess of a die. The fourth requirement is that the lead-out portion is embedded in the plastic part and led out of the plastic part in the thickness direction of the plastic part, or alternatively the lead-out portion is led through and out of the holder in the thickness direction. If the lead-out portion of the external connection is led through and out of the holder in the thickness direction, the embedded portion may be omitted.

The lead-out portion of the external connection may pass from the bottom face to the top face (distal face) of the holder as in the First and Third to Fifth Embodiments. However, the lead-out portion only needs to be embedded in the plastic part and led out of the plastic part in the thickness direction of the plastic part, or alternatively be led through and out of the holder in the thickness direction. For example, the lead-out portion may be modified to pass from a side face to the distal face of the external connection. The lead-out portion may be embedded in the holder by insert molding or other means.

The embedded portion of the external connection may be fixed to the first face of the sheet as in the First and Third to Fifth Embodiments. The embedded portion may not be fixed to the sheet. Alternatively, a part of the embedded portion may be fixed to the sheet. In this case, the mounted portion or the first mounted portion of the holder may be mounted on the fixed part of the embedded portion.

The external connection may be a flexible printed circuit or a flexible insulating transparent film as in the First to Fifth Embodiments and the above example modification. However, the external connection may be in any other form, such as a lead wire, a header pin, and a rigid board.

The plastic part may be generally of U-shape in sectional view as in the First to Fifth Embodiments and the above example modification. However, the plastic part may be of any other shape, such as a flat plate-like shape. The sheet may be modified to be of any shape conforming to the shape of the plastic part.

The sheet may be provided on the plastic part as in the First to Fifth Embodiments and the above example modification, but the sheet may be omitted. Further, the sheet may be transparent and flexible as in the First to Fifth Embodiments and the above example modification. However, the sheet may alternatively be translucent and flexible, opaque and flexible, translucent and inflexible, or opaque and inflexible. The sheet may be made of a material that does not harden (does not lose flexibility) after the molding of the plastic part. The sheet may be provided with ornamental printing as in the embodiments or without any ornamental printing.

The device of the device module may be a touch sensor used as a capacitive touch panel. However, the device of the invention may be any type of sensor, any type of electronic component, or any type of circuit board. The sensor may be of any type including a touch panel of type other than the capacitive type (for example, a touch panel of resistive film-type, optical-type, ultrasonic-type, or in-cell type), a touch switch (for example, a touch switch of capacitive, resistive film-type, optical-type, ultrasonic-type, or in-cell type), or a sensor other than the touch panel and the touch switch (for example, a magnetic sensor, an optical sensor, or a light-dark sensor) can be used. In the touch panel and the touch switch (touch sensor), the electrode may be provided on the sheet by any well-known printing method. The touch panel and the touch switch may be opaque. The touch sensing surface of the touch panel or the touch switch is not limited to the second surface of the sheet. For example, the touch sensing surface may be an outer surface of a panel provided on the side of the outer surface of the sheet. Also, an electronic component or a circuit board in place of a sensor may be embedded in the plastic part. Examples of the electronic component include active components (for example, semiconductor) and passive components (for example, a resistor, a capacitor, and a coil). The sensor, electronic component, or circuit board may be embedded in the plastic part in any manner. For example, the sensor, electronic component, or circuit board may be embedded in the plastic part leaving a gap from the sheet.

The device module may be manufactured using the first and second dies as described for the First to Fifth Embodiments. However, the first and second dies may be modified in any manner as long as they are configured to be combined with each other to create a cavity therebetween and the first die has a housing recess communicating with the cavity. For example, the first and second dies may each have a recess and the recesses of the combined first and second dies may form a cavity. Alternatively, the first and second dies may be modified such that a projection provided on the second die is inserted into a recess provided in a first die, and the projection and the recess may form a cavity. In this case, the housing recess may communicate with the recess of the first die. The sprue can be provided in at least one of the first and second dies.

In the First to Fourth Embodiments, a part of the edge of the housing recess 12 (on the left in the associated figure) forms the tapered portion 12a. However, the tapered portion 12a may be omitted. The entire edge of the housing recess may be tapered such that distances between opposed areas of the edge in the lengthwise direction and in the short direction of the device module gradually increase toward the open side of housing recess. The minimum requirement to guide the exposed portion of the holder into the housing recess is that the exposed portion is tapered, and/or that at least a part of the edge of the housing recess of the first die forms a tapered portion in such a manner that the distance between the opposed areas of the edges gradually increases toward the open side.

The edge of the housing recess 12 may be provided with the annular fitting projection 12a' as in the Fifth Embodiment. However, the fitting projection 12a' may be omitted. Alternatively, the fitting projection may be of any other shape conforming to the shape of the fitting recess of the holder.

The device module of the First to Fifth Embodiments may be manufactured as described above or by any other methods including partially fixing an external connection to a holder, a first end of the external connection being connected to a device, the device being a sensor, an electronic component, or a circuit board; placing the device, a first end portion of the external connection, and the holder into a cavity of first and second dies, inserting a second end portion of the external connection into a housing recess of the first die, and closing the housing recess of the first die with the holder; and in this state, injecting plastic material into the cavity to insert-mold the device, the first end portion of the external connection, and the holder in the plastic material.

As in the First and Third to Fifth Embodiments, the holder may be securely held between the first die and the second die via the sheet and the embedded portion of the external connection when the sheet, the embedded portion of the external connection (the first end portion of the external connection), and the holder are placed in the cavity. As in the Second Embodiment, the holder may be securely held between the first die and the second die via the sheet when the sheet, the embedded portion of the external connection (the first end portion of the external connection), and the base of the holder are placed in the cavity. However, the holder may be held in any other manner as long as the holder is brought into contact with the first die to close the housing recess of the first die and into direct or indirect contact with the second die when the device, the first end portion of the external connection, and the holder are placed in the cavity of the first and second dies. If the sheet is omitted as mentioned above, the holder may be held directly between the first and second dies during the insert molding process. Alternatively, the holder may be securely held between the first and second dies via something else other than the sheet and/or the embedded portion of the external connection during the insert molding process. Further alternatively, the holder may be fixed to the first die with an adhesive so as to close the housing recess of the first die during the insert molding process. This arrangement can reduce the possibility of the movement of the holder and the external connection due to the injection pressure of the plastic material during the insert molding process without securely holding the holder between the first and second dies. Naturally, the holder may be fixed to the first die with an adhesive so as to close the housing recess of the first die during the insert molding process even when the holder is securely held between the first and second dies.

As in the First and Third to Fifth Embodiments, the touch sensor and the embedded portion of the external connection may be fixed to the first face of the sheet during the insert molding process. As in the Second Embodiment, the touch sensor may be fixed to the first face of the sheet during the insert molding process. However, these components do not have to be fixed to the first face of the sheet during the insert molding process. For example, the components may be fixed on the projection of the first die. In this case, the components may be embedded in the plastic part with a gap from the sheet. Alternatively, the components may be fixed to a spacer mounted on the first face of the sheet. It is also possible to fix only these components to the sheet, the projection, or the spacer without fixing the embedded portion of the external connection to any of the sheet, the projection, or the spacer. It is also possible to fix only the embedded portion of the external connection to the sheet, the projection, or the spacer without fixing the components to any of the sheet, the projection, or the spacer.

It should be appreciated that the above-described embodiments and modifications are described by way of examples only. The materials, shapes, dimensions, numbers, arrangements, and other configurations of the device module and the first and second dies may be modified as long as they provide the same functions.

REFERENCE SIGNS LIST 100 sheet
101 first face
102 second face
200 plastic part
201 first face
202 second face
300 touch sensor (device)
400 external connection
410 embedded portion (first end portion of external connection)
420 lead-out portion (second end portion of external connection)
500 holder
510 base
520 exposed portion (distal portion of holder)
530 through hole
400' external connection
410' embedded portion (first end portion of external connection)
420' lead-out portion (second end portion of external connection)
500' holder
510' base
520' exposed portion (distal portion of holder)
500" holder
510" base
520" exposed portion (distal portion of holder)
500''' holder
501''' part
510''' base
520''' exposed portion (distal portion of holder)
530''' through hole
500'''' holder
501'''' part
510'''' base
520'''' exposed portion (distal portion of holder)
530'''' through hole

The invention claimed is:

1. A method of manufacturing a device module, the method comprising:
partially fixing an external connection directly to a holder, the external connection being flexible in its entirety and including:
a fixed portion being fixed directly to the holder,
a first end portion being located closer to a first end of the external connection than the fixed portion and including the first end, the first end being connected to a device that is a sensor, and
a second end portion being located closer to a second end of the external connection than the fixed portion and led out of the holder and including the second end;

closing first and second dies to form a cavity of the first and second dies, the closing of the first and second dies including (1) placing the device, the first end portion of the external connection, and the fixed holder into the cavity of the first and second dies, (2) inserting the second end portion of the external connection into a housing recess of the first die, and (3) closing the housing recess of the first die with the fixed holder; and
after the closing of the first and second dies, injecting plastic material into the cavity to insert-mold the device, the first end portion of the external connection, and the holder in the plastic material.

2. The method according to claim 1, wherein
the closing of the housing recess includes fitting a distal portion of the holder in the housing recess of the first die.

3. The method according to claim 2, wherein
the distal portion of the holder is tapered.

4. The method according to claim 2, wherein
at least a part of an edge of the housing recess of the first die forms a tapered portion.

5. The method according to claim 1, wherein
the closing of the housing recess includes fitting a fitting projection into a fitting recess of the holder, the fitting projection being provided on an edge of the housing recess of the first die.

6. The method according to claim 1, wherein
the placing of the device, the first end portion of the external connection, and the holder into the cavity includes placing a sheet in the cavity, disposing at least a part of the external connection on the sheet, disposing the holder on the at least the part of the external connection, and bringing the holder on the sheet into contact with the first die to close the housing recess of the first die, and
the injecting of the plastic material includes injecting the plastic material on the sheet to insert-mold the device, the first end portion of the external connection, and the holder on the sheet with the plastic material.

7. The method according to claim 1, wherein
the placing of the device, the first end portion of the external connection, and the holder includes bringing the holder into contact with the first die and the second die to close the housing recess of the first die.

8. The method according to claim 1, wherein
the closing of the housing recess of the first die including fixing the holder to the first die.

9. The method according to claim 6, wherein
a gap is left between the holder and the sheet in the cavity, and
the injecting of the plastic material into the cavity includes flowing the plastic material into the gap.

10. The method according to claim 1, wherein
the holder has a through hole passing through the holder, and
the fixing of the external connection to the holder includes inserting the external connection into the through hole of the holder.

11. The method according to claim 1, wherein
the fixing of the external connection to the holder includes fixing the fixed portion of the external connection to an outer face of the holder, and
the closing of the housing recess of the first die includes closing the housing recess with the fixed portion of the external connection and the holder.

12. The method according to claim 1, wherein
the fixing of the external connection to the holder includes insert-molding the fixed portion of the external connection in the holder.

13. The method according to claim 1, wherein
the holder includes a plurality of pieces configured to surround the fixed portion of the external connection,
the fixing of the external connection to the holder includes combining the plurality of pieces to surround the fixed portion of the external connection.

14. The method according to claim 1, wherein
the holder is made of plastic material that is the same as or in a same group as that of the plastic part.

15. A method of manufacturing a device module, the method comprising:
partially fixing an external connection directly to a holder, the external connection being flexible in its entirety and including:
a fixed portion being fixed directly to the holder,
a first end portion being located closer to a first end of the external connection than the fixed portion and including the first end, the first end being connected to a device that is a circuit board, and
a second end portion being located closer to a second end of the external connection than the fixed portion and led out of the holder and including the second end;
closing first and second dies to form a cavity of the first and second dies, the closing of the first and second dies including (1) placing the device, the first end portion of the external connection, and the fixed holder into the cavity of the first and second dies, (2) inserting the second end portion of the external connection into a housing recess of the first die, and (3) closing the housing recess of the first die with the fixed holder; and
after the closing of the first and second dies, injecting plastic material into the cavity to insert-mold the device, the first end portion of the external connection, and the holder in the plastic material.

16. A method of manufacturing a device module, the method comprising:
partially fixing an external connection directly to a holder, the external connection being flexible in its entirety and including:
a fixed portion being fixed directly to the holder,
a first end portion being located closer to a first end of the external connection than the fixed portion and including the first end, the first end being connected to a device that is one of a semiconductor, a resistor, a capacitor, and a coil, and
a second end portion being located closer to a second end of the external connection than the fixed portion and led out of the holder and including the second end;
closing first and second dies to form a cavity of the first and second dies, the closing of the first and second dies including (1) placing the device, the first end portion of the external connection, and the fixed holder into the cavity of the first and second dies, (2) inserting the second end portion of the external connection into a housing recess of the first die, and (3) closing the housing recess of the first die with the fixed holder; and
after the closing of the first and second dies, injecting plastic material into the cavity to insert-mold the device, the first end portion of the external connection, and the holder in the plastic material.

17. The method according to claim 1, wherein the external connection is a flexible printed circuit or a flexible insulating transparent film.

18. The method according to claim 15, wherein the external connection is a flexible printed circuit or a flexible insulating transparent film.

19. The method according to claim 16, wherein the external connection is a flexible printed circuit or a flexible insulating transparent film.

20. The method according to claim 1, wherein the device is a touch sensing device.

* * * * *